United States Patent [19]

Krause et al.

[11] 4,097,731
[45] Jun. 27, 1978

[54] AUTOMATIC GAIN CONTROL FOR PHOTOSENSING DEVICES

[75] Inventors: Thomas R. Krause, Troy; Eugene E. Paananen, Brighton; John F. Burcz, Detroit, all of Mich.

[73] Assignee: Burroughs Corporation, Detroit, Mich.

[21] Appl. No.: 802,731

[22] Filed: Jun. 2, 1977

[51] Int. Cl.² .................................................. G01J 1/32
[52] U.S. Cl. .............................. 250/205; 250/214 AG; 250/214 B; 356/205
[58] Field of Search ............... 250/214 B, 214 G, 205; 356/205

[56] References Cited

U.S. PATENT DOCUMENTS

| 3,297,904 | 1/1967 | Lauxen | 250/205 |
| 3,721,963 | 3/1973 | Jenne | 250/205 |

Primary Examiner—M. Tokar
Attorney, Agent, or Firm—Robert C. J. Tuttle; Carl Fissell, Jr.; Kevin R. Peterson

[57] ABSTRACT

A beam-of-light (BOL) sensor having means for regulating the intensity of the sensor light source to compensate for extraneous factors in the operating environment, e.g. dust accumulation, that may affect consistent sensor operation. The BOL sensor includes a photosensor whose output signal is compared against a reference signal to determine if the light source intensity is of the proper level. The comparison signal is transformed into a digital pulse that adjusts the stored count of a counter upward or downward in accordance with the comparison of the photosensor signal and reference signal. The adjusted count is converted to analog form and fed back to drive the light source.

A trailing edge detector enables the counter to count up or down when an object is in the sensing station defined by the light source and photosensor.

A hole filter is provided to filter out small, spurious apertures in a sensed object that would otherwise yield a double detection signal and cause an improper adjustment of the stored count.

18 Claims, 9 Drawing Figures

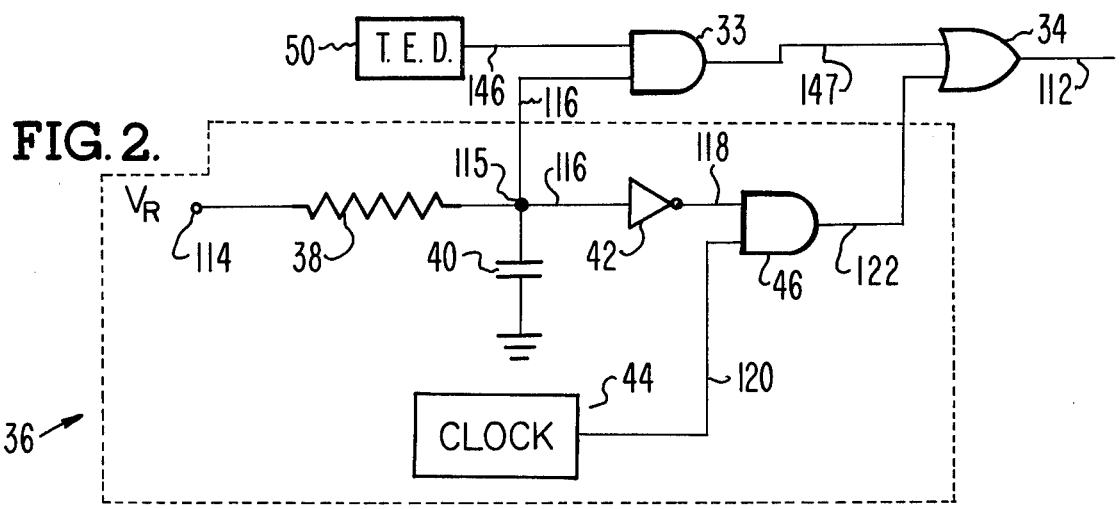
FIG. 2.
FIG. 3.
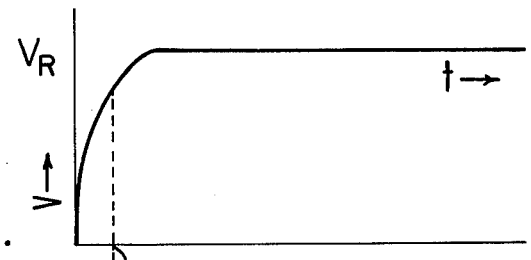
FIG. 3A.
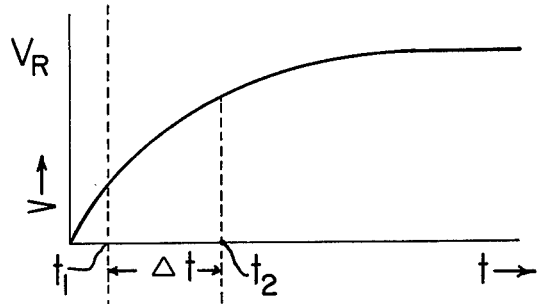
FIG. 3B.
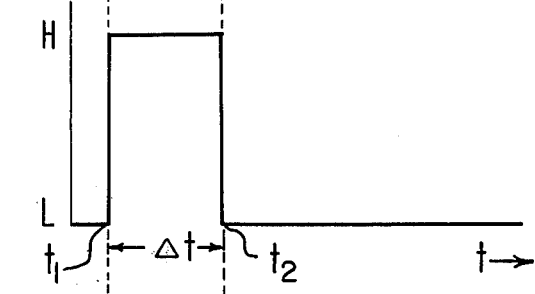
FIG. 3C.
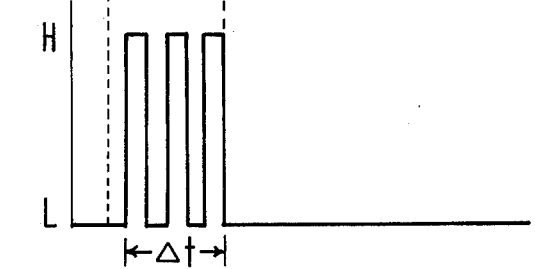
FIG. 3D.

AUTOMATIC GAIN CONTROL FOR PHOTOSENSING DEVICES

BACKGROUND OF THE INVENTION

1. Field of the Invention

The present invention relates to optical sensors, and more particularly to a beam-of-light sensor incorporating means for compensating irregularities in the intensity of the sensor light source.

2. Description of the Prior Art

Beam-of-light (BOL) sensors are used in applications where it is necessary to know when an object, e.g. a document, passes through a certain point and to provide a signal indicative thereof.

A BOL sensor commonly includes a light source whose beam is directed at the position at which the object is to be sensed. A light sensitive transducer, such as a phototransistor, is mounted in aligned relationship with the light source. When the BOL sensor is used in the direct mode, the light transducer will be responsive to an interruption of the light incident upon it by the interposition of the sensed object between the light source and phototransistor. When used in the reflective mode, the light transducer will be responsive to the incidence of light upon it that is reflected off the sensed object.

In practical application, the BOL sensor components are subject to extraneous influences in the operating environment that affect sensor performance. For example, when the BOL sensor is used in document detection, there is an ever present problem of dust accumulation upon the windows of the light source and the light transducer. Additionally, each of the components may age and operate at variance with its design specifications.

One solution to the problem is to schedule frequent preventive maintenance periods to physically clean the sensor and tests its performance level. However, this is costly in terms of personnel time and increases down time of the machine. A second, more desirable solution, would be to design a BOL sensor that includes self-compensating means to adapt the output of the light source to compensate for any factors impairing normal sensor operation. A practicable implementation of the second solution is a primary objective of the present invention.

BRIEF SUMMARY OF THE INVENTION

The present invention is a beam-of-light sensor unit including means for adapting to extraneous influences in its operating environment. More specifically, the BOL sensor is set to operate at a predetermined performance level, and when its operation departs from that performance level, such departures are sensed and compensated for by adjusting the operating parameters of the associated light source.

Broadly, the BOL sensor includes a light source and a phototransducer that is mounted in aligned relation with the source and responsive to the incidence of light thereon. Where there is no object in the path of the light source, the phototransducer output is taken and compared against a reference output level. An error signal is generated dependent upon whether the output is high or low. A stored count is adjusted in accordance with the polarity of the error signal and then fed back through a digital to analog converter to regulate the drive current to the light source.

Another feature of the invention is the inclusion of a trailing edge detector. The function of the trailing edge detector is to allow the adjustment of the stored count only while an object is absent from the sensing station defined by the light source and phototransducer. Were it not for the trailing edge detector, the comparison between the phototransducer output and the reference output level during the time the object is in the sensing station would continuously indicate that the stored count need be adjusted, causing the stored count to be adjusted to an extreme level if the object remains in the sensing station for a sustained period, e.g. a document jam.

Still another feature of the invention is a hole filter. The function of the hole filter is to filter out or override minor holes or transparencies in the sensed object, e.g. a staple hole in a document, that may otherwise be interpreted as a trailing edge of the object. The hole filter works in cooperation with the trailing edge detector and will filter out any hole or transparency below a minimum predetermined dimension.

Other advantages of the present invention will be readily appreciated as the same becomes better understood by reference to the following detailed description when considered in connection with the accompanying drawings.

BRIEF DESCRIPTION OF THE DRAWING

FIG. 2 is a schematic representation of the initialization circuit of FIG. 1 used to preset the stored count;

FIG. 3A-3D shows time plots of the various signal outputs in the circuit of FIG. 2;

DETAILED DESCRIPTION OF A SPECIFIC EMBODIMENT

Figure 1:
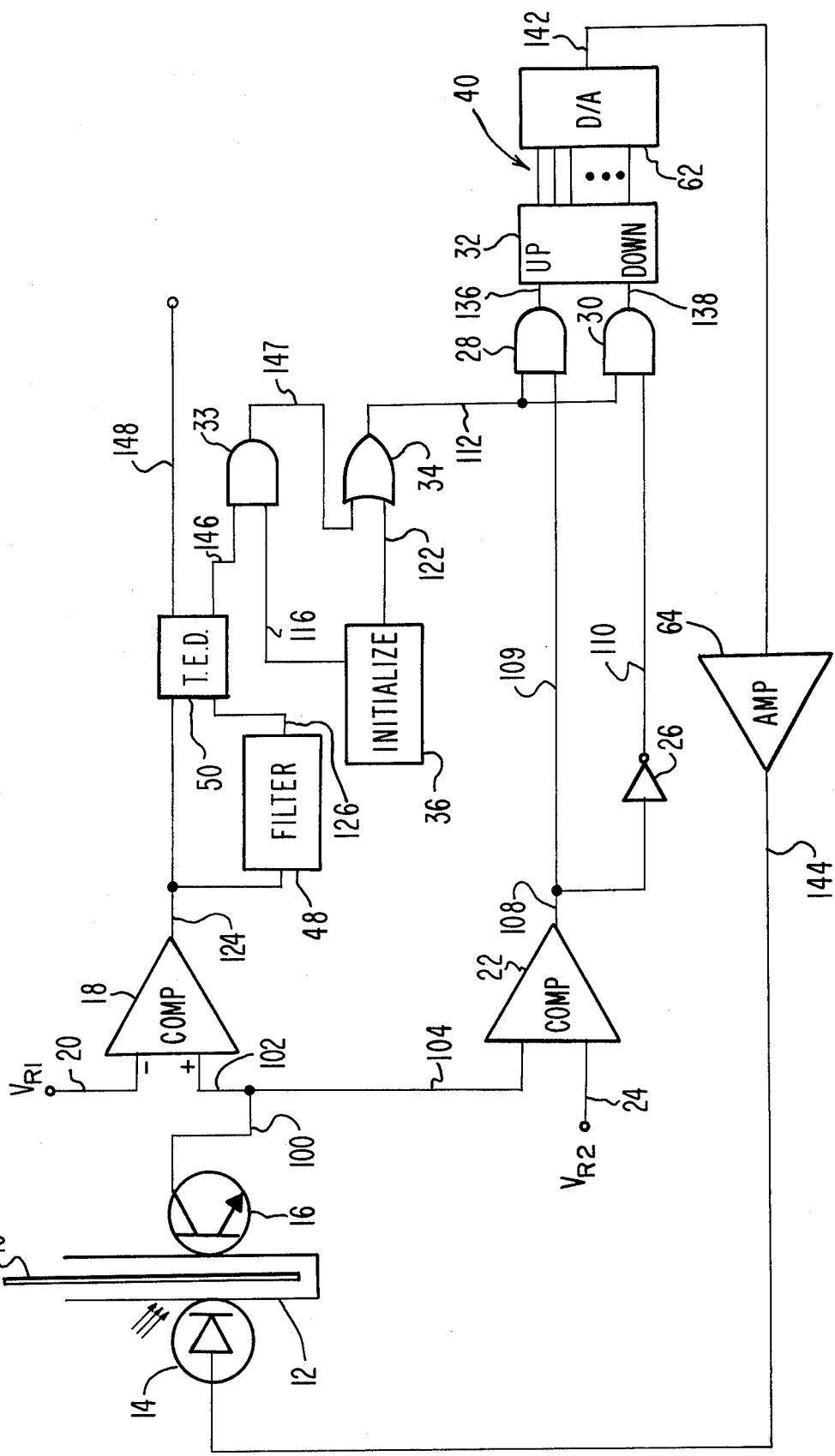
FIG. 1 is a schematic illustration of the beam-of-light sensor of the present invention.

FIG. 1 is a schematic representation of a beam-of-light sensor incorporating the present invention. The sensor to be hereinafter described is sensitive to the presence of an object in a sensing station to provide a detection signal representing the same.

Accordingly, in FIG. 1, a document 10 representing the sensed object is transported along a track 12. At a certain position along the length of the track a sensing station is defined by a light emitting diode (LED) 14 and a phototransistor (PT) 16, the PT being mounted in aligned relation with the LED and responsive to its light output. When the document 10 is in the sensing station, its opacity interrupts the communication of light from the LED 14 to the PT 16 and causes the collector lead 100 of the PT 16 to go high. When the document 10 is absent from the sensing station, light communication is re-established and the collector lead 100 goes low.

The signal on lead 100 branches off in two directions on lines 102 and 104. Line 102 develops into a path whose eventual output significes the presence or non-presence of a document. Line 104 develops into a feedback path that monitors or regulates the intensity of the LED 14 to assure a consistent output of the phototransistor 16. Each of the paths initiated by lines 102 and 104 will be individually described as follows.

Line 102 is fed as a signal input to a comparator 18. The second input to comparator 18 is a threshold-defining, reference voltage $V_{R1}$ on line 20. When the signal input on line 102 exceeds the reference voltage input on line 20, the comparator output 124 undergoes a low to high signal level transition that signifies the presence of a document in the sensing station. The output of comparator 18 is input to a filter 48 and trailing edge detector 50 whose function and operation will hereinafter be discussed in detail.

Line 104 is similarly provided as a signal input to a second comparator 22. The second input to comparator 22 is a threshold-defining reference voltage $V_{R2}$ on line 24. When the document 10 is absent from the sensing station, the PT 16 will saturate and the collector voltage 100 go low. Accordingly, if the signal level on line 104 is less than the reference voltage $V_{R2}$, it indicates that the PT 16 is receiving too much light from the LED 14 and saturating beyond its desired level, driving down too far the collector voltage 100. In this case the level output on line 108 of the comparator 22 will be low. Alternatively, if the signal level on line 104 exceeds the reference voltage $V_{R2}$, it signifies that the LED 14 is emitting less light than desired, and the level output on comparator 22 will be high.

The output of comparator 22 on line 108 divides into an asserted branch 109, and an inverted branch 110 that includes an inverter 26. Lines 109 and 110 are each provided as a first input to respective AND gates 28 and 30. The output of AND gate 28 is communicated on line 136 to the UP input of an up/down counter 32, and the output of AND gate 30 is similarly communicated on line 138 to the DOWN input of the counter 32. Accordingly, when the output of the comparator 22 is low, signifying the over-intensity of the LED 14, and AND gate 28 will be disabled and the AND gate 30 will be enabled, allowing the DOWN input of the counter 32 to respond. Alternatively, when the output of the comparator 22 is high, signifying the under-intensity of the LED 14, the AND gate 30 will be disabled and AND gate 28 will be enabled, allowing the UP input of the counter 32 to respond.

The second input signal 112 to each of the AND gates 28 and 30 is taken from the output of an OR gate 34. The OR gate 34 is enabled whenever the signal on lines 122 or 146 is high. Line 122 represents the output of an initialization circuit 36 that provides an initializing burst of pulses to preset the up/down counter 32. Line 147 is related to the output of the trailing edge detector 50 that is provided to allow the up/down counter 32 to be adjusted only after a document 10 has passed through the sensing station. The initialization circuit 36 and the trailing edge detector 50, along with the associated filter 48, will now be hereinafter described in greater detail.

With reference to FIG. 2, the initialization circuit 36 is shown within the block defined by the dashed lines. Additionally, so much as is pertinent of the trailing edge detector 50 is also shown to illustrate the relationship between the initialization circuit 36 and the trailing edge detector 50.

The purpose of the initialization circuit 36 is to provide a burst of initializing pulses that presets the up/down counter 32. The circuit 36 includes a time-delay, R-C circuit defined by the serial connection of a resistor 38 and capacitor 40. The R-C circuit is energized at terminal 114 by a reference voltage source $V_R$, conventionally five volts. The output of the R-C circuit is taken off line 116 at node 115 which is common to resistor 38 and capacitor 40. Line 116 is put through an inverter 42 whose output on line 118 is input to an AND gate 46. The second input to the AND gate 46 is from line 120, representing the output of a free-running clock 44.

When the beam-of-light sensor is turned on, the reference voltage $V_R$ and free-running clock 44 will both experience a system rise time. This rise time is represented in FIG. 3A by $t_1$. After the reference voltage $V_R$ has risen to its operating level, the voltage level at node 115 will start to rise as the capacitor 40 charges up. FIG. 3B is a time plot of the voltage at node 115. The point at which capacitor 40 reaches a high logic level voltage is designated by $t_2$. The interval between the time at which $V_R$ becomes operational and the time the capacitor 40 becomes changed is designated by $\Delta t$ and is directly related to the time constant of the R-C circuit and the system rise time.

FIG. 3C represents the logic signal level of the output 118 of inverter 42 over the time interval indentified by $\Delta t$. Through the rise time between O and $t_1$, the system is unenergized and the inverter output is low. During the time interval from $t_1$ to $t_2$ when the capacitor 40 is charging up, the input 116 to the inverter 42 is low, causing the output to be a logically high signal. For the time interval after $t_2$, the signal on line 116 is high, causing the output on line 118 to be low. In accordance with FIG. 3C, and AND gate 46 will be low except during the time interval designated by $\Delta t$.

During the interval between $t_1$ and $t_2$, and AND gate 46 will be open for the output of the free-running clock 44. The clock 44 will output a series of pulses on line 120. The number of pulses output is a function of the time constant of the R-C circuit and may be adjusted by modifying the R-C parameters. These pulses will be gated through AND gate 46 on line 122. FIG. 3B represents this output signal pattern on line 122.

Referring again to FIG. 1, the pulses on line 122 are gated through OR gate 34 on line 112. During the initialization period, the output of comparator 22 will be high, reflecting the under-intensity of the LED 14. Accordingly, both inputs 109 and 112 to AND gate 28 will be high allowing the pulse pattern represented by FIG. 3B to be received by the UP input of the up/down counter 32.

Referring again to FIG. 2, the trailing edge detector 50 is disabled during the initialization of the counter 32 to prevent it from interfering with the initialization. The signal on line 116, which is the invert of FIG. 3C, is provided as one input to an AND gate 33. The second input to the AND gate 33 is the output 146 of the trailing edge detector 50. During the time interval from $t_1$ to $t_2$, the logic signal level at node 115 will be low, disabling the AND gate 33 and preventing the output of the trailing edge detector 50 from passing to the OR gate 34.

Figure 4:
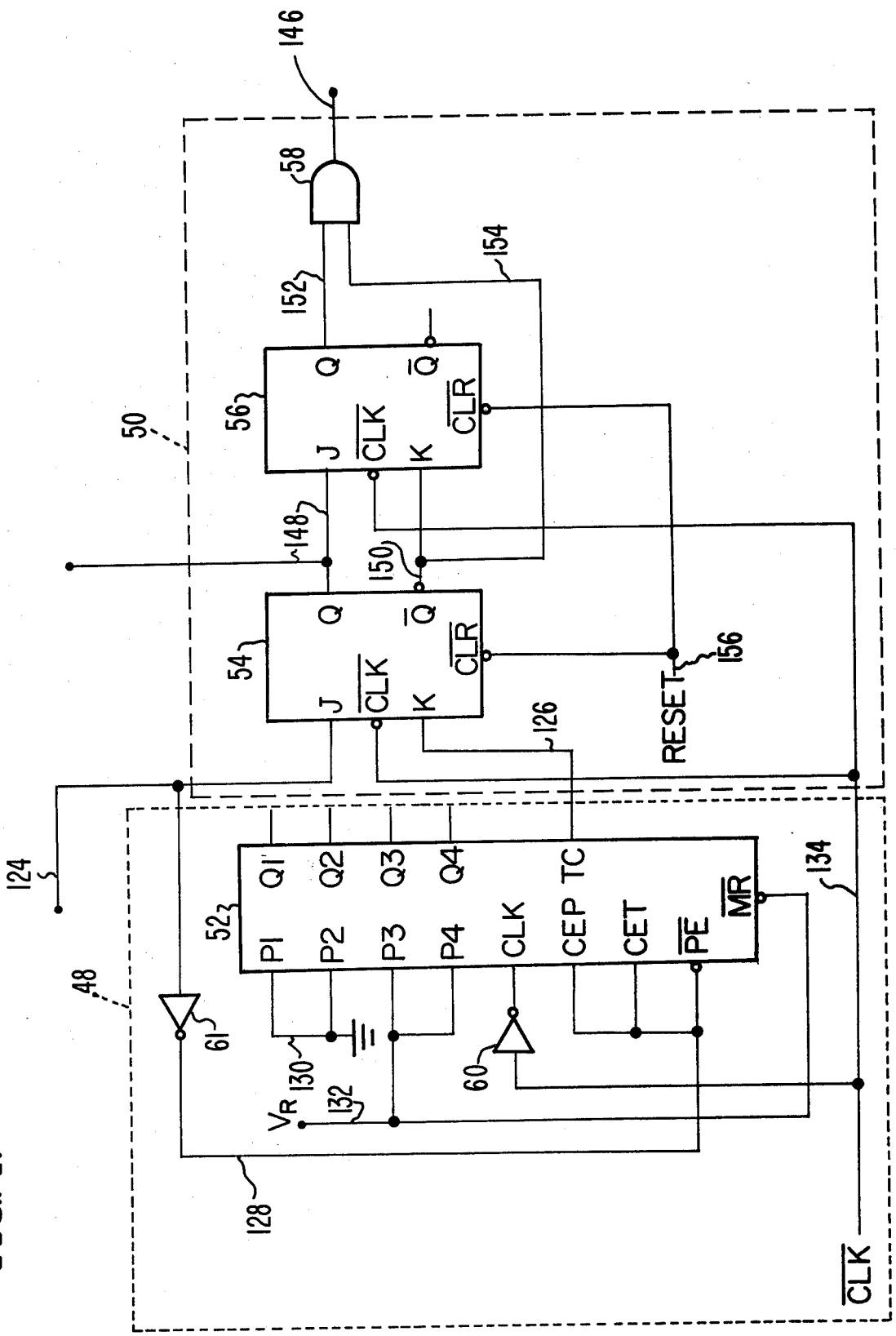
FIG. 4 is a schematic illustration of the hole filter and trailing edge detector of FIG. 1 showing the cooperation therebetween.

Referring now to FIG. 4, the trailing edge detector 50 and associated hole filter 48 will be hereinafter described in detail. The primary purpose of the trailing edge detector 50 is to allow the up/down counter 32 to count up or down only after a document 10 has passed through the sensing station. The primary purpose of the hole filter 48 is to filter out spurious signals from the phototransistor 16 caused by small holes in the document 10, e.g. a staple hole or the like to prevent a plurality of signals from being generated for a single document.

The hole filter 48 receives its input from the comparator 18 on line 124. A representative example of the signal level on line 124 is shown in the curve labeled COMP in the timing diagram of FIG. 5. The comparator 18 generally follows the collector voltage 100 of the phototransistor 16, which is shown as the curve labled PT in the timing diagram of FIG. 5. With reference to both the PT and COMP curves, the leading edge of the document first passes the sensing station at time $t_0$. The document may be assumed to have two spurious holes in it which are manifested by the two glitches on the PT and COMP curves. The leading edges of the glitches are designated by $t_3$ and $t_5$ and the trailing edges are designated by $t_4$ and $t_6$. The actual trailing edge of the document occurs at $t_7$.

The essential component of the hole filter 48 is a four-bit, binary counter 52, such as a TTL SN 74LS161. The binary counter 52 has four data input terminals P1, P2, P3 and P4, representing the 1, 2, 4 and 8 bit positions respectively. There are three control input signals, CEP, CET, and PE/ (the virgule symbol is hereinafter used to denote the inverted mode). The PE/ control input enables parallel loading of the data inputs. The CET (count enable trickle) input allows the carry bit of the counter to be enabled when high. The CEP (count enable parallel) allows the counter to count upon the receipt of a clock signal when high. A clock input CLK is provided through line 134 from an inverted clock source CLK/ and reinverted through an inverter 60.

The counter 52 has four data output terminals Q1, Q2, Q3 and Q4, each representing the 1, 2, 4 and 8 bit positions respectively. A carry bit is output on terminal TC. A master reset MR/ is provided to clear the counter for subsequent operation.

The four data inputs P1, P2, P3 and P4 are all preloaded. Specifically, P1 and P2 are tied together to ground through line 130. P3 and P4 are tied together and held high at a reference voltage $V_R$, nominally five volts, through line 132. Similarly, the MR/ input is constantly held high to prevent the counter from clearing. The effect of holding the four data inputs at predetermined levels in the manner indicated is to load a 12 count into the counter when counting is enabled.

Figure 5:
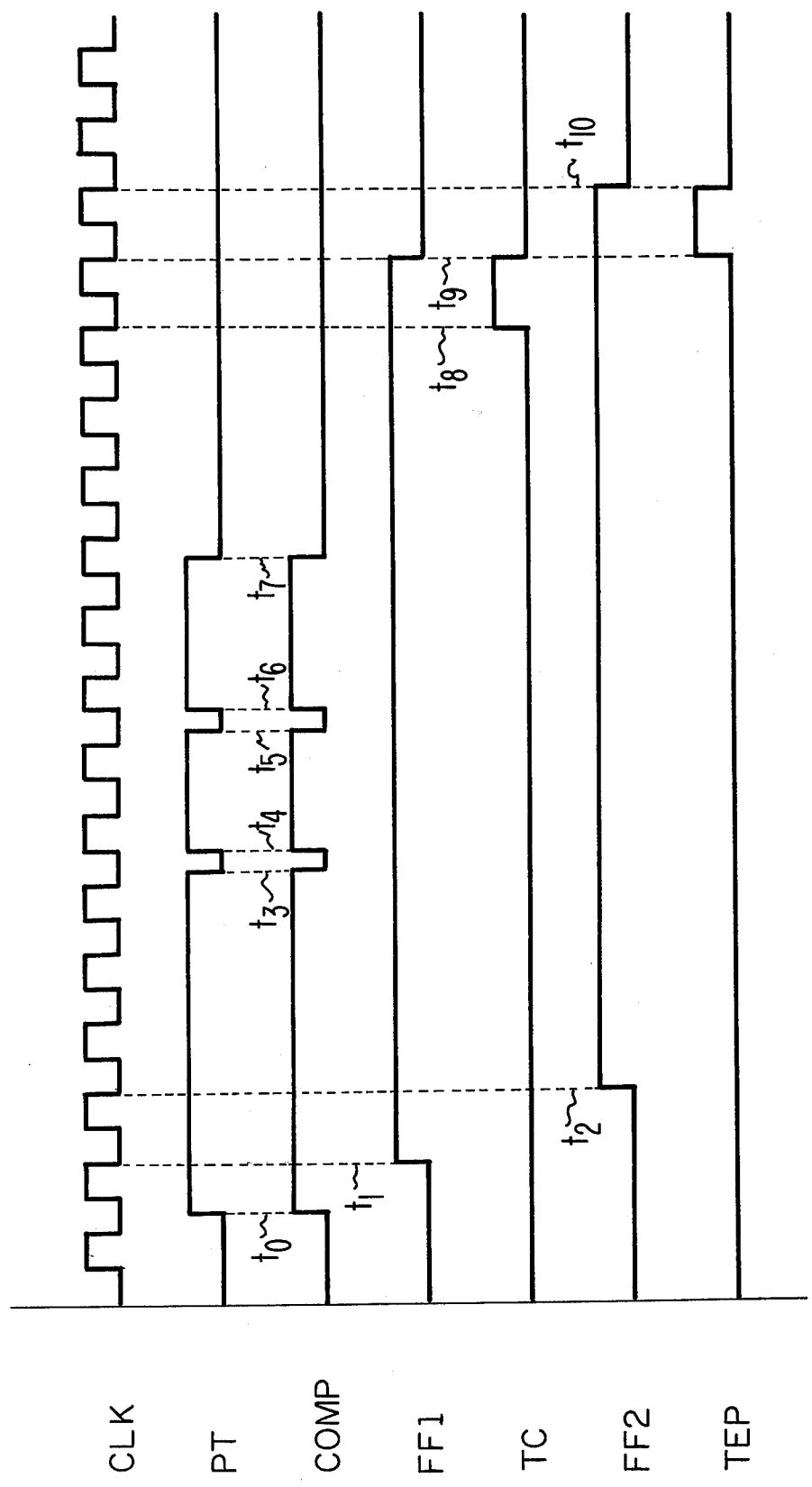
FIG. 5 is a timing diagram for the system illustrated in FIGS. 1, 2 and 4.

The three control inputs, PE/, CET and CEP are all tied together and receive input on line 128. The signal on line 128 is the direct inversion of the input on line 124 by means of an inverter 61. Accordingly, when the signal level on the curve labeled COMP of FIG. 5 is high, the input signal on line 128 is low. In this instance, the CEP input and CET inputs are disabled. On the other hand, the PE/ input is enabled allowing the counter to load a data signal on P1, P2, P3 and P4, i.e. a 12. When the signal on the COMP curve of FIG. 5 is low, the input signal on line 128 is high, disabling the PE/ terminal and enabling the CET and CEP terminals. The enablement of the CEP terminal allows the counter to count up one unit with each clock pulse. The enablement of the CET terminal allows a carry bit to be output on terminal TC. The data output terminals Q1, Q2, Q3 and Q4 are not needed in this application and are allowed to float.

Considering now the specific signal on the COMP curve of FIG. 5, the leading edge of the document occurs at time $t_0$, and causes the signal on line 128 to go low. This low signal disables CEP and CET, while enabling PE/. For as long as the control input signal is low, the counter will repetitively load the data inputs on P1, P2, P3 and P4 with each clock pulse.

At time $t_3$, the leading edge of a spurious hole will cause the control signal on line 128 to go low and remain low until the trailing edge of the hole at time $t_4$. However, unless the time duration of the hole is of sufficient length to enable the counter 52 to count through three clock pulses, the count will simply reset at 12 and leave the TC output 126 unchanged, effectively ignoring or filtering out the hole. In a similar manner, the short glitch appearing between times $t_5$ and $t_6$ will also be filtered out.

At time $t_7$, the actual trailing edge of the document is detected and a downward transition occurs in the signal level on line 124. Accordingly, the control signal on line 128 goes high disabling the PE/ control input and enabling the CET and CEP control inputs. The signal on line 128 will remain high until another document is detected. With the enablement of the CEP input the counter 52 will count up one unit with each clock pulse beginning at the preloaded level of 12. With the enablement of the CET input, a carry bit will appear at the TC output 126 when the counter reaches 15, i.e. three clock pulses later as indicated at time $t_8$ on the TC curve of FIG. 5. The TC output 126 will remain high for one clock pulse and then return low as indicated at time $t_9$. In short, the hole filter 48 will ignore or filter out spurious holes in the document by means of a three clock delay.

The trailing edge detector 50 has dual functions and operates in conjunction with the hole filter 48 to perform those functions. The first function is to assure that a single document passing through the sensing station is represented by a continuous, uninterrupted detection signal, notwithstanding small, spurious holes or transparencies in the document. The second function is to allow the up/down counter 32 to adjust its stored count only after a document has passed through the sensing station.

The trailing edge detector 50 includes first and second, serially-connected J-K flip flops 54 and 56. Each flip flop 54 and 56 is characterized by a J (set) and K (reset) input. The outputs of each flip flop are identified as Q and Q/, with the latter being the inversion of the former. An inverted clock input is provided on line 134 to each of the CLK/ inputs. Each flip flop is cleared by an inverted reset signal on line 156 to its CLR/ input.

The J input of J-K flip flop 54 receives its input directly on line 124. The K input of flip flop 54 is coupled to the TC output 126 of the four bit binary counter 52. Assuming that the flip flop 54 is initially cleared, it will set, i.e. the Q output will go high with the first negative clock transition after the leading edge of the document is detected. Specifically, in FIG. 5, this time is identified as $t_1$. The J input of the second J-K flip flop 54 is directly coupled to the Q output of the first J-K flip flop 54. Accordingly, the second flip flop 56 will set or go high one clock pulse after the first flip flop 54 sets. This is identified in FIG. 5 as time $t_2$. Both flip flops 54 and 56 will remain set irrespective of the spurious holes associated with times $t_3$, $t_4$, $t_5$ and $t_6$ because the K inputs are maintained at zero through insulation by the hole filter 48.

At time $t_8$, the TC output 126 of the counter 52 will come up and take up with it the K input of the first flip flop 54. The Q output of flip flop 54 will then toggle with the next clock pulse at time $t_9$. Accordingly, the J and K inputs to flip flop 56 will reverse polarity causing flip flop 56 to reset one clock pulse later as indicated at time $t_{10}$. For the time interval between time $t_9$ and $t_{10}$, both inputs to AND gate 58 on lines 152 and 154 will be high, allowing the output of AND gate 58 to be high on line 146. This may be seen on the curve labeled TEP in FIG. 5. Referring to FIG. 2, this trailing edge pulse on line 146 will cause output line 147 of AND gate 33 to go high for the duration of the pulse. This will open the normally closed OR gate 34 and allow the pulse to pass through on line 112.

Moreover, the Q output of flip flop 54, as evidenced by the curve labeled FFI in FIG. 5, will give a continuous detection signal on line 148 that closely approximates the actual time interval the document is in the sensing station. The signal on line 148 will be protracted by three clock periods, but will be free of interruptions caused by spurious transparencies.

Referring now to FIG. 1, the pulse on line 112 will open whichever of the AND gates 28 or 30 that has its other input high. If the input 109 to AND gate 28 is high, a count-up pulse will appear on line 136. If the signal on line 110 is high, a count-down pulse will appear on line 138. Thusly, the stored count on the counter 32 is adjusted once with the passage of each document to compensate for any irregularity in the light intensity of the LED 14.

The output lines 140 of the up/down counter 32 are input to a digital to analog converter 62. The output of the converter on line 142 is an analog signal that is input to a buffer amplifier 64. The output of the buffer amplifier is communicated to the LED 14 to regulate its intensity in accordance with the adjusted stored count on up/down counter 32.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, the invention may be practiced otherwise than as specifically described.

The embodiments of the invention in which an exclusive property or privilege is claimed are defined as follows:

1. A self-regulating beam-of-light sensor device for sensing the presence of an object in a sensing station comprising:
   a light source having its output directed at the sensing station;
   a phototransducer means, disposed in aligned relationship with said light source and responsive to the output thereof, for developing a detection signal in accordance with the presence of an object in the sensing station;
   first comparator means for comparing the detection signal with a first reference signal level and outputting a signal representing the presence of an object when the detection signal exceeds the first reference signal;
   second comparator means for comparing the detection signal with a second reference signal level and outputting a count signal of a first level if the second reference signal exceeds the detection signal, and of a second level if the detection signal exceeds the second reference signal;
   counter means, responsive to the output of the second comparator means, for decrementing a stored count if the count signal is of the first level, and incrementing the stored count if of the second level; and
   feedback means, responsive to the stored count of the counter means, for regulating the output intensity of the light source in accordance with the stored count to compensate for extraneous factors affecting the intensity of the source.

2. The device as defined in claim 1, further comprising trailing edge detection means for disabling the counter means while the object to be sensed is present in the sensing station, and enabling the counter means after the detection of the trailing edge of the object.

3. The device as defined in claim 2, wherein the trailing edge detection means is defined to include a plural-stage shift register that responds to an output signal from the first comparator means to disable the counter means, and responds to the absence of an output signal from the first comparator means to enable the counter means.

4. The device as defined in claim 3, wherein the plural-stage shift register is defined to include first and second serially-connected flip flops, the first flip flop receiving as input the output of the first comparator means and the second flip flop having an output controlling the enablement of the counter means.

5. The device as defined in claim 1, wherein the feedback means is defined to include D/A converter means, responsive to the stored count, for converting the stored count to an equivalent analog signal.

6. The device as defined in claim 1, further including initializer means for initializing the stored count of counter means.

7. The device as defined in claim 6, wherein the initializer means are defined to include an electrical energization source characterized by a relatively short rise time, a resistive-capacitive network, energizable by the source, and characterized by a relatively longer time constant, a source of clock pulses, and means for gating the clock pulses to the counter means for a time interval related to the time difference between the time constant of the network and rise time of the energization source.

8. The device as defined in claim 1, further including filter means for filtering out interruptions in the detection signal below a minimum predetermined time duration.

9. The device as defined in claim 8, wherein the filter means is defined to include delay counter means, responsive to an interruption in the detection signal, for counting the duration of the interruption in predetermined clock units and filtering out the interruption if its duration is below a minimum number of clock pulses.

10. An improved beam-of-light sensor device for detecting the presence of an object in a sensing station, the device being of the class having a light source disposed at a first position with respect to the sensing station and a photosensor disposed at second position with respect to the sensing station and responsive to the light beam emitted by the light source, the improvement comprising:
   compensation means for adjusting the energization of the light source to compensate for extraneous factors affecting the intensity of the light beam, the compensation means being defined to include:
   comparator means, having as a first input the output of the photosensor and as a second input a reference signal related to the desired intensity of the light beam, for outputting a count signal of a first level if the second input exceeds the first input, and of a second level if the first input exceeds the second input;

counter means, responsive to the output of the comparator means, for adjusting a stored count in accordance with the level of the count signal; and feedback means, responsive to the stored count of the counter means, for regulating the intensity of the electromagnetic wave energy source in relation to the stored count.

11. The device as defined in claim 10, further comprising trailing edge detection means for disabling the counter means while the object to be sensed is present in the sensing station, and enabling the counter means upon the detection of the trailing edge of the object.

12. The device as defined in claim 11, wherein the trailing edge detection means is defined to include a plural-stage shift register that responds to an output signal from the comparator means to disable the counter means, and responds to the absence of an output signal from the comparator means to enable the counter means.

13. The device as defined in claim 12, wherein the plural-stage shift register is defined to include first and second serially-connected flip-flops, the first flip-flop receiving as input the output of the comparator means and the second flip-flop having an output controlling the enablement of the counter means.

14. The device as defined in claim 10, wherein the feedback means is defined to include D/A converter means, responsive to the stored count, for converting the stored count to an equivalent analog signal.

15. The device as defined in claim 10, further including initializer means for initializing the stored count of the counter means.

16. The device as defined in claim 15, wherein the initializer means are defined to include an electrical energization source characterized by a relatively short rise time, a resistive-capacitive network, energizable by the source, and characterized by a relatively longer time constant, a source of clock pulses, and means for gating the clock pulses to the counter means for a time interval related to the time difference between the time constant of the network and rise time of the energization source.

17. The device as defined in claim 10, further including filter means for filtering out interruptions in the photosensor output below a minimum predetermined time duration.

18. The device as defined in claim 17, wherein the filter means is defined to include delay counter means, responsive to an interruption in the photosensor output, for counting the duration of the interruption in predetermined clock units and filtering out the interruption if its duration is below minimum number of clock pulses.

* * * * *